US010475942B2

(12) United States Patent
Anantram et al.

(10) Patent No.: US 10,475,942 B2
(45) Date of Patent: Nov. 12, 2019

(54) PHOTODETECTOR CELL AND SOLAR PANEL WITH DUAL METAL CONTACTS AND RELATED METHODS

(71) Applicants: Manjeri P. Anantram, Seattle, WA (US); Md Golam Rabbani, Seattle, WA (US); Mahmoud M. Khader, Doha (QA); Reza Nekovei, Corpus Christi, TX (US); Amit Verma, Cypress, TX (US)

(72) Inventors: Manjeri P. Anantram, Seattle, WA (US); Md Golam Rabbani, Seattle, WA (US); Mahmoud M. Khader, Doha (QA); Reza Nekovei, Corpus Christi, TX (US); Amit Verma, Cypress, TX (US)

( * ) Notice: Subject to any disclaimer, the term of this patent is extended or adjusted under 35 U.S.C. 154(b) by 0 days.

(21) Appl. No.: 15/978,382

(22) Filed: May 14, 2018

(65) Prior Publication Data

US 2018/0261705 A1    Sep. 13, 2018

Related U.S. Application Data

(62) Division of application No. 14/972,693, filed on Dec. 17, 2015, now Pat. No. 9,997,656.

(60) Provisional application No. 62/093,295, filed on Dec. 17, 2014.

(51) Int. Cl.
| | |
|---|---|
| *H01L 31/0352* | (2006.01) |
| *H01L 31/02* | (2006.01) |
| *H01L 27/144* | (2006.01) |
| *H01L 31/103* | (2006.01) |
| *H01L 31/0224* | (2006.01) |

(Continued)

(52) U.S. Cl.
CPC .. *H01L 31/035281* (2013.01); *H01L 27/1446* (2013.01); *H01L 31/02005* (2013.01); *H01L 31/028* (2013.01); *H01L 31/022425* (2013.01); *H01L 31/03529* (2013.01); *H01L 31/035227* (2013.01); *H01L 31/1037* (2013.01); *H01L 31/11* (2013.01); *Y02E 10/547* (2013.01)

(58) Field of Classification Search
CPC ............... H01L 31/035227; H01L 27/1446
See application file for complete search history.

(56) References Cited

U.S. PATENT DOCUMENTS

| | | | | |
|---|---|---|---|---|
| 2011/0281288 A1* | 11/2011 | Chen | ............... | G01N 33/5438 435/15 |
| 2012/0192939 A1* | 8/2012 | Tamboli | .......... | H01L 31/035227 136/256 |
| 2013/0068286 A1* | 3/2013 | Wang | ............. | H01L 31/035227 136/249 |

OTHER PUBLICATIONS

"Multiple silicon nanowires-embedded Schottky solar cell", Applied Physics Letters 95, 143112 (2009) by Kim.*

(Continued)

*Primary Examiner* — Farun Lu
(74) *Attorney, Agent, or Firm* — Allen, Dyer, Doppelt + Gilchrist, PA

(57) ABSTRACT

A photodetector cell may include a substrate, and a first contact carried by the substrate and having a first work function value. The photodetector cell may include a second contact carried by the substrate and having a second work function value different from the first work function value, and a semiconductor wire carried by the substrate and having a third work function value between the first and second work function values. The semiconductor wire may be coupled between the first and second contacts and comprising a photodiode junction.

18 Claims, 13 Drawing Sheets

(51) Int. Cl.
  *H01L 31/028* (2006.01)
  *H01L 31/11* (2006.01)

(56) References Cited

OTHER PUBLICATIONS

"Rational Design and Synthesis of Freestanding Photoelectric Nanodevices as Highly Efficient Photocatalysts", Nano Lett. May 12, 2010; 10(5): 1941-1949 by Qu.*
Kim et al. "Multiple silicon nanowires-embedded Schottky solar cell", Applied Physics Letters 95, 143112 (2009); See Priority U.S. Appl. No. 14/972,693, filed Dec. 17, 2015.
Qu et al. "Rational Design and Synthesis of Freestanding Photoelectric Nanodevices as Highly Efficient Photocatalysts" Nano Lett. May 12, 2010; 10(5): 1941-1949; See Priority U.S. Appl. No. 14/972,693, filed Dec. 17, 2015.
Sun et al. "Silicon-Nanowire-Based Schottky Diode With Near-Ideal Breakdown Voltage" IEEE Electron Device Letters, vol. 31, No. 11, Nov. 2010; See Priority U.S. Appl. No. 14/972,693, filed Dec. 17, 2015.

* cited by examiner

PHOTODETECTOR CELL AND SOLAR PANEL WITH DUAL METAL CONTACTS AND RELATED METHODS

RELATED APPLICATION

This application is a divisional of U.S. patent application Ser. No. 14/972,693 filed Dec. 17, 2015, which is based upon prior filed copending Application No. 62/093,295 filed Dec. 17, 2014, the entire subject matters of which are incorporated herein by reference in their entireties.

TECHNICAL FIELD

The present disclosure relates to the field of photovoltaic devices, and, more particularly, to photodetector cells and related methods.

SUMMARY

In view of the foregoing background, it is therefore an object of the present disclosure to provide a photodetector cell that is efficient and robust.

This and other objects, features, and advantages in accordance with the present disclosure are provided by a photodetector cell comprising a substrate, and a first contact carried by the substrate and having a first work function value. The photodetector cell may include a second contact carried by the substrate and having a second work function value different from the first work function value, and at least one semiconductor wire carried by the substrate and having a third work function value between the first and second work function values. The at least one semiconductor wire may be coupled between the first and second contacts and comprising a photodiode junction. Advantageously, the work function disparity between the first and second contacts may increase photovoltaic efficiency of the photodetector cell.

For example, the first contact may comprise nickel, and the second contact may comprise aluminum. The at least one semiconductor wire may comprise a silicon nanowire. The at least one semiconductor wire may have a length about five times a minority carrier diffusion length in the photodiode junction.

In some embodiments, the first and second contacts may comprise ohmic contacts. In other embodiments, the first contact may comprise an ohmic contact, and the second contact may comprise a Schottky contact. The photodetector cell may further include a dielectric layer over the at least one semiconductor wire.

Another aspect is directed to a solar panel comprising a plurality of photodetector cells. Each photodetector cell may include a substrate, a first contact carried by the substrate and having a first work function value, a second contact carried by the substrate and having a second work function value different from the first work function value, and at least one semiconductor wire carried by the substrate and having a third work function value between the first and second work function values. The at least one semiconductor wire may be coupled between the first and second contacts and may comprise a photodiode junction.

Another aspect is directed to a method for making a photodetector cell. The method may include forming a first contact carried by a substrate and having a first work function value, forming a second contact carried by the substrate and having a second work function value different from the first work function value, and forming at least one semiconductor wire carried by the substrate and having a third work function value between the first and second work function values. The at least one semiconductor wire may be coupled between the first and second contacts and may comprise a photodiode junction.

BRIEF DESCRIPTION OF THE DRAWINGS

FIGS. 2A-28 are diagrams of excess electron density and photocurrent, respectively, in the photodetector cell of FIG. 1A.

FIG. 3 is a diagram of photocurrent in the photodetector cell of FIG. 1A.

FIGS. 5A-6B are diagrams of photocurrent in the photodetector cell of FIG. 1A.

FIG. 7 is a diagram of open circuit voltage in the photodetector cell of FIG. 1A.

FIG. 9 is a diagram of short circuit current density in the photodetector cell of FIG. 1A.

FIG. 10 is a schematic perspective view of another embodiment of the photodetector cell, according to the present disclosure.

FIG. 13 is a diagram of short circuit current and open circuit voltage in the photodetector cell of FIG. 12B.

DETAILED DESCRIPTION

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 1A:
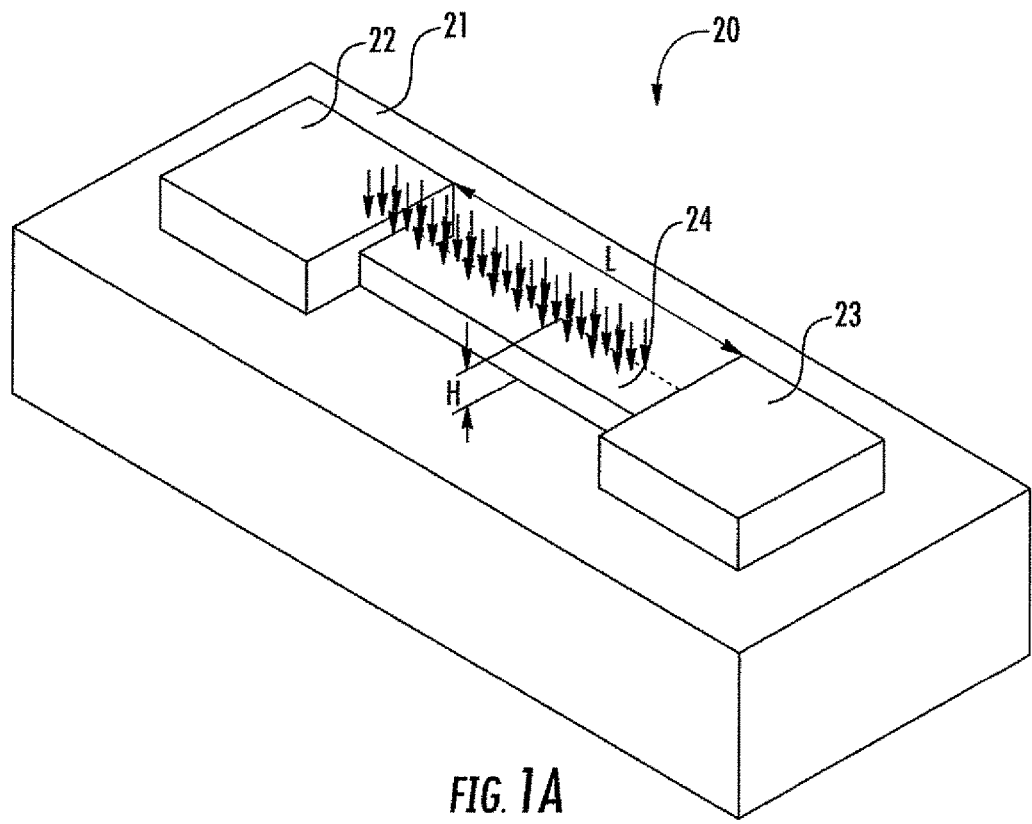
FIG. 1A is a schematic perspective view of a photodetector cell, according to the present disclosure.
Figure 12A:
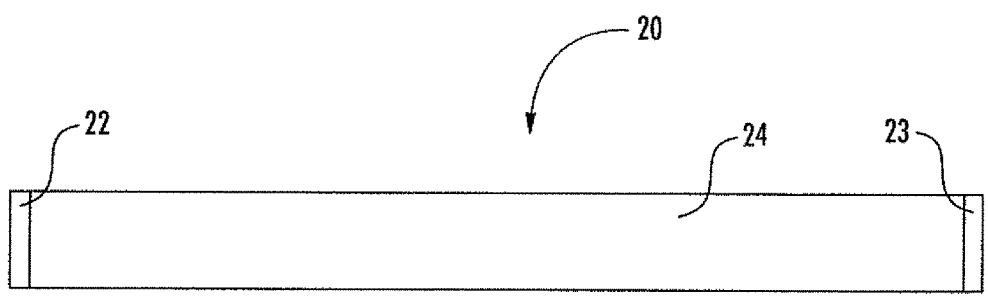
FIGS. 12A and 12B are schematic side views of the photodetector cell from FIG. 1A without the substrate and another embodiment of the photodetector cell, respectively, according to the present disclosure.

Referring initially to FIGS. 1A and 12A, a photodetector cell 20 according to the present disclosure is now described. The photodetector cell (e.g. a solar cell) 20 illustratively includes a substrate 21, and a first contact (i.e. the anode) 22 carried by the substrate and having a first work function value. The photodetector cell 20 illustratively includes a second contact (i.e. the cathode) 23 carried by the substrate 21 and having a second work function value different from the first work function value, and a semiconductor wire 24 carried by the substrate and having a third work function value between the first and second work function values. The semiconductor wire 24 is coupled between the first and second contacts 22, 23 and comprises a photodiode junction (i.e. a photovoltaic cell) for converting the incident radiation (noted as downward arrows on semiconductor wire). Advantageously, the work function disparity between the first and second contacts may increase photovoltaic efficiency of the photodetector cell.

For example, the first contact 22 may comprise nickel, and the second contact 23 may comprise aluminum. The semiconductor wire 24 may comprise a silicon nanowire. The semiconductor wire 24 may have a length about five times a minority carrier diffusion length in the photodiode junction.

In some embodiments, the first and second contacts 22, 23 may comprise ohmic contacts. In other embodiments, the first contact 22 may comprise an ohmic contact, and the second contact 23 may comprise a Schottky contact. The photodetector cell 20 may further include a dielectric layer over the semiconductor wire 24.

Figure 1B:
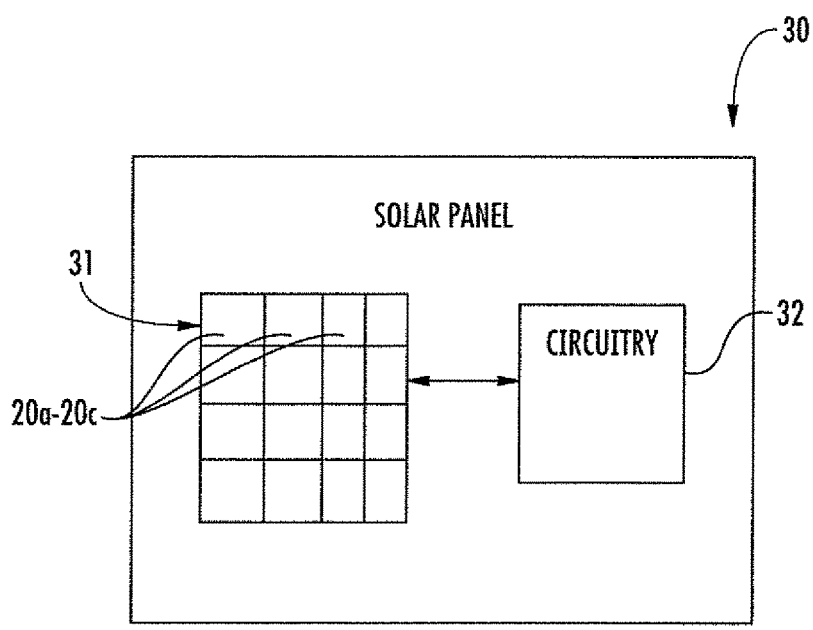
FIG. 1B is a schematic diagram of a solar panel comprising the photodetector cell of FIG. 1A.

Referring now additionally to FIG. 1B, a solar panel 30 illustratively includes a plurality of photodetector cells (i.e. an array of solar cells) 20a-20c, and circuitry (e.g. transformer, anti-islanding) 32 coupled thereto. Each photodetector cell 20a-20c includes a substrate 21, a first contact 22 carried by the substrate and having a first work function value, a second contact 23 carried by the substrate and having a second work function value different from the first work function value, and a semiconductor wire 24 carried by the substrate and having a third work function value between the first and second work function values. The semiconductor wire 24 may be coupled between the first and second contacts 22, 23 and comprises a photodiode junction.

Another aspect is directed to a method for making a photodetector cell 20. The method may include forming a first contact 22 carried by a substrate 21 and having a first work function value, forming a second contact 23 carried by the substrate and having a second work function value different from the first work function value, and forming at least one semiconductor wire 24 carried by the substrate and having a third work function value between the first and second work function values. The at least one semiconductor wire 24 may be coupled between the first and second contacts 22, 23 and may comprise a photodiode junction.

Figure 10:
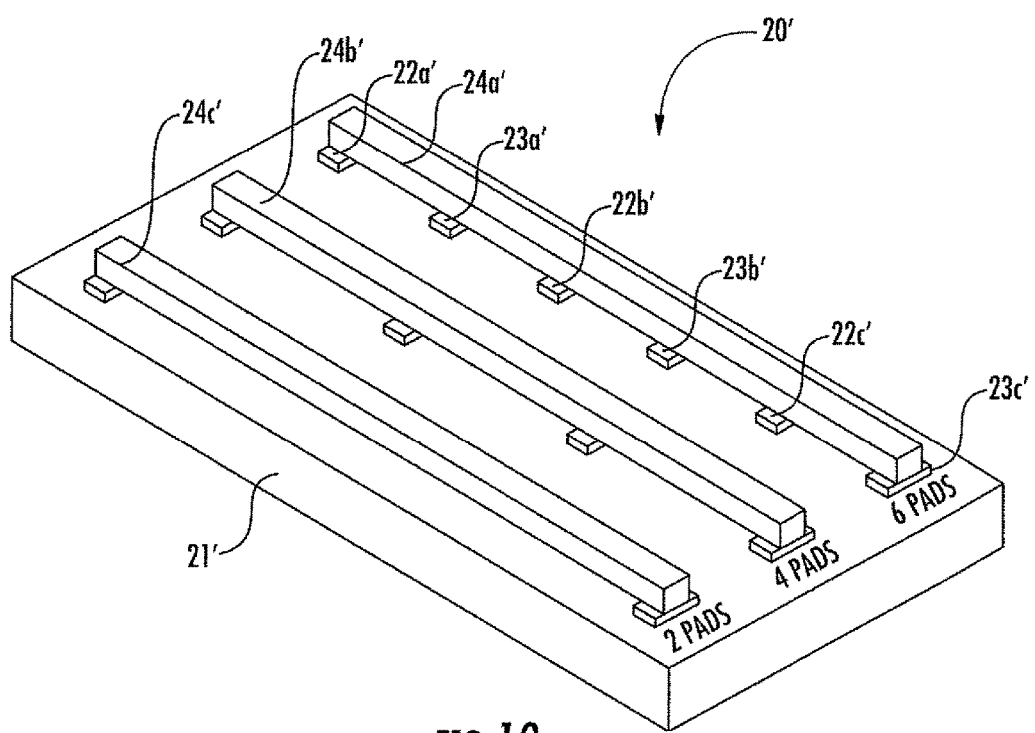

Referring now briefly to FIG. 10, another embodiment of the photodetector cell 20' is now described. In this embodiment of the photodetector cell 20', those elements already discussed above with respect to FIGS. 1A-1B are given prime notation and most require no further discussion herein. This embodiment differs from the previous embodiment in that this photodetector cell 20' has a plurality of semiconductor wires 24a'-24c' (i.e. an array thereof). Also, the photodetector cell 20' illustratively includes a plurality of first contacts 22a'-22c' and a plurality of second contacts 23a'-23c' for each semiconductor wire 24a'-24c'.

Figure 12B:
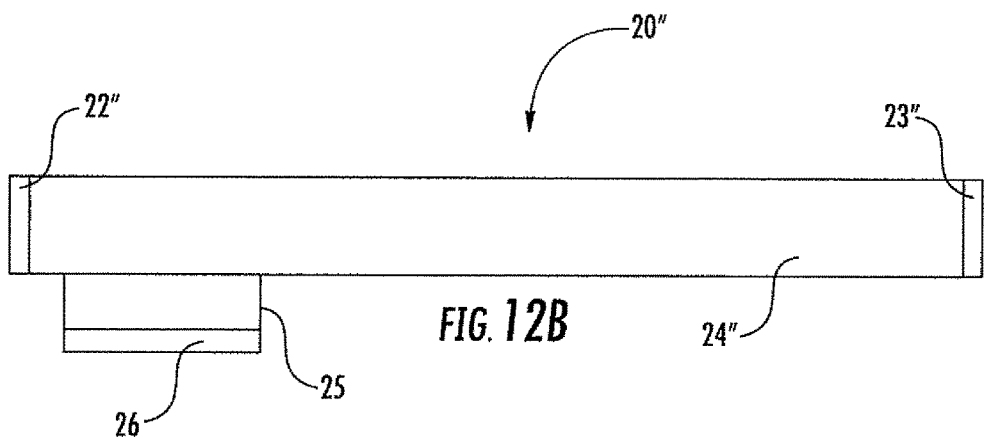
Figure 13:
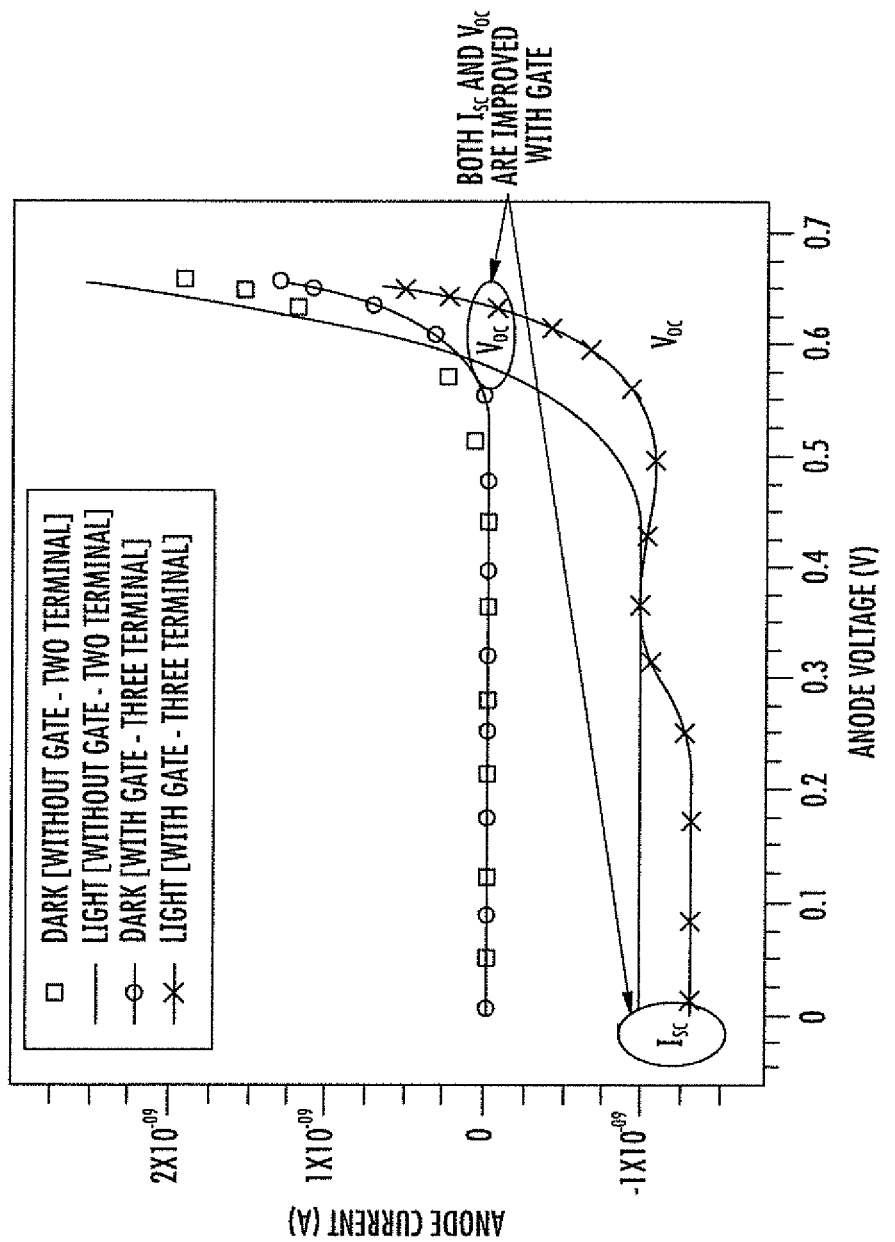

Referring now briefly to FIGS. 12B and 13, another embodiment of the photodetector cell 20" is now described. In this embodiment of the photodetector cell 20', those elements already discussed above with respect to FIGS. 1A-1S and 12A are given double prime notation and most require no further discussion herein. This embodiment differs from the previous embodiment in that this photodetector cell 20" illustratively includes a gate stack over the semiconductor wire 24" adjacent the first contact 22" (i.e. the anode). The gate stack comprises a dielectric layer (e.g. silicon dioxide) 25" adjacent the semiconductor wire 24", and an electrically conductive gate layer (e.g. metallic material) 26" over the dielectric layer. The diagram in FIG. 13 illustrates how the gate stack advantageously reduces both the short circuit current and the open circuit voltage of the photodetector cell 20".

One dimensional nanomaterials like nanowires and nanotubes hold great potential for many applications such as electronics [1,2], sensors [3,4], and photovoltaics [5-7]. Nano engineered materials like nanowires and nanotubes are considered to be potential candidates for low cost and high efficiency solar cells. There have been many studies on solar cells based on single as well as multiple nanowires [8-11]. Tsakalakos et al. [8] studied p-n junction based silicon nanowire solar cells on metal foils, and found large current density and low optical reflectance. Sivakov et al. [9] fabricated silicon nanowire solar cells by electroless wet chemical etching of micro crystalline silicon layer on glass and achieved a high power conversion efficiency of 4.4%. Tian et al. [10] studied single p-i-n coaxial silicon nanowires and measured open circuit voltage ($V_{oc}$) of 0.26 V and short circuit current ($I_{sc}$) of 0.503 nA. Experimental study on Schottky solar cells comprising multiple SiNWs bridging two different metals with different work functions was carried out by Kim et al. [11]. They obtained a low $V_{oc}$ of 0.167 V but high $I_{sc}$ of 91.1 nA. Kelzenberg et al. [12] studied single-nanowire solar cells with one rectifying junction created by electrical heating of the segment of the nanowire beneath it. For a nanowire of diameter 900 nm, they achieved a $V_{oc}$ of 0.19 V and a short circuit current density of 5.0 mA cm$^{-2}$. Hybrid Schottky diode solar cells [13] with poly(3,4-ethylenedioxythiophene) poly(styrenesulfonate) (PEDOT:PSS) film deposited on metal-assisted chemically etched SiNW arrays produced $V_{oc}$ of ~0.48 V and $J_{sc}$ of ~30 mA/cm$^2$. These works on nanowire based solar cells primarily focus on experimental investigations to demonstrate their potential in realizing the next generation of solar cells. However, a detailed study on the influence of various parameters like nanowire dimensions and work function of the metal contacts in modifying the photovoltaic behavior of the nanowires is lacking. In the present disclosure, results are provided from simulation studies on Schottky junction based microwire and nanowire solar cells, and the present disclosure investigates the dependence of their photovoltaic properties on metal work functions, wire dimensions as well as minority carrier lifetimes.

2. DEVICE STRUCTURE, PROBLEM STATEMENT

FIG. 1A is a sketch of the device structure under study. There are two dissimilar metal pads, with dissimilar work functions, bridged by a rectangular cross-section wire. L, W and H represent the wire length, width and height, respectively. The array of downward pointing arrows represents vertically downward incident light beam. Only the top surface (of area L×W) of the wire is illuminated. The effect of substrate is not considered in this disclosure. Performance enhancing features such as an antireflection coating or back reflector have not been included so as to keep the focus on the role of the silicon wire and metal contacts.

The present disclosure focuses on understanding how device dimensions and minority carrier lifetimes affect the photovoltaic properties (short circuit current, open circuit voltage, I-V characteristics) of the solar cell. The present disclosure also investigates the effects of the metal work functions on the solar cell performance, and explores ways to improving the efficiency of the solar cells, including the selection of metals. Simulation is done with Silvaco Atlas software [14]; details are given in Appendix A.

3. SIMULATION VERSUS ANALYTICAL SOLUTIONS

A simulation can be verified against a one dimensional (1D) analytical solution. For this, it is assumed that the contacts are Ohmic. For the simulation part, a microwire with L=6.8 μm, W=1.0 μm, H=0.85 μm was 2D simulated using the approach described in the previous section. For the analytical solution, the present disclosure considers the one dimensional (1D) minority carrier diffusion equation along wire length in the presence of an electric field [15]:

$$D_n \frac{\partial^2 \Delta n}{\partial x^2} + \mu_n \frac{\partial}{\partial x}(E[n_0 + \Delta n]) - \frac{\Delta n}{\tau_n} + G_L = 0; \quad (1)$$

where $D_n$ is carrier diffusion coefficient, $\mu_n$ carrier mobility, E is the electric field, $n_0$ is equilibrium carrier density, $\Delta n$ is photo-generated (excess) electron density, $\tau_n$ is electron lifetime, and $G_L$ is photo-generation rate, E is the constant along length for Ohmic contacts.

Then excess minority carrier concentration, $\Delta n$, is found by solving Eq. (1), which is a linear second order differential equation having a solution of the form $$\Delta n = A e^{m_1 x} + B e^{m_2 x} + C; \quad (2)$$

where $$m_{1,2} = -\frac{\mu_n E}{2 D_n} \pm \sqrt{\left(\frac{\mu_n E}{2 D_n}\right)^2 + \frac{1}{D_n \tau_n}}.$$

The constants A, B and C are found from the boundary conditions, $\Delta n(x=0)=0$ at the left contact and $\Delta n(x=L)=0$ at the right contact, and are given by $$A = C\left(\frac{1 - e^{m_2 L_x}}{e^{m_2 L_x} - e^{m_1 L_x}}\right), C = G_L \tau_n \text{ and } B = -A - C. \quad (3)$$

Here $G_L$ along the 1D line for analytical calculation is extracted from two dimensional (2D) $G_L$ generated by Atlas simulator. Eq. (2) along with Eq. (3) represents the analytical expression of the excess minority carrier density. Analytical expression for current can be calculated by first finding the current densities as given below $$J_n = q\mu_n nE + qD_n \nabla n$$

$$J_p = q\mu_p pE - qD_p \nabla n \text{[as } \nabla p = \nabla n]; \quad (4)$$

where E is the electric field, $D_{n(p)} = kT\mu_{n(p)}/q$ is electron (hole) diffusion constant. Then total current, I, is found by multiplying the total current density by the cross sectional area, A, of the wire, or $I = A(J_n + J_p)$.

Figure 2A:
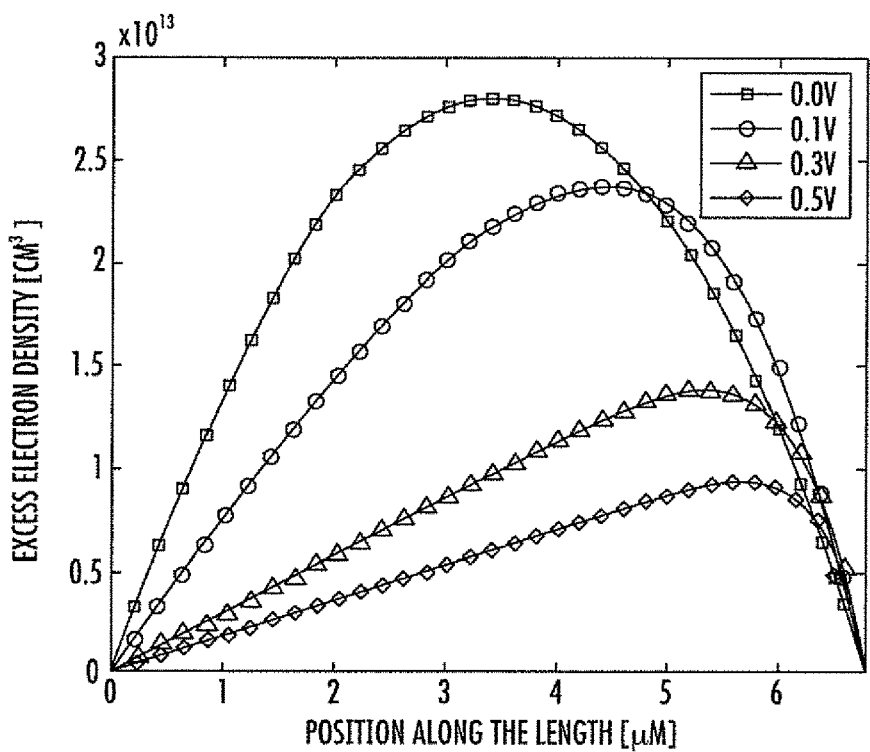
Figure 2B:
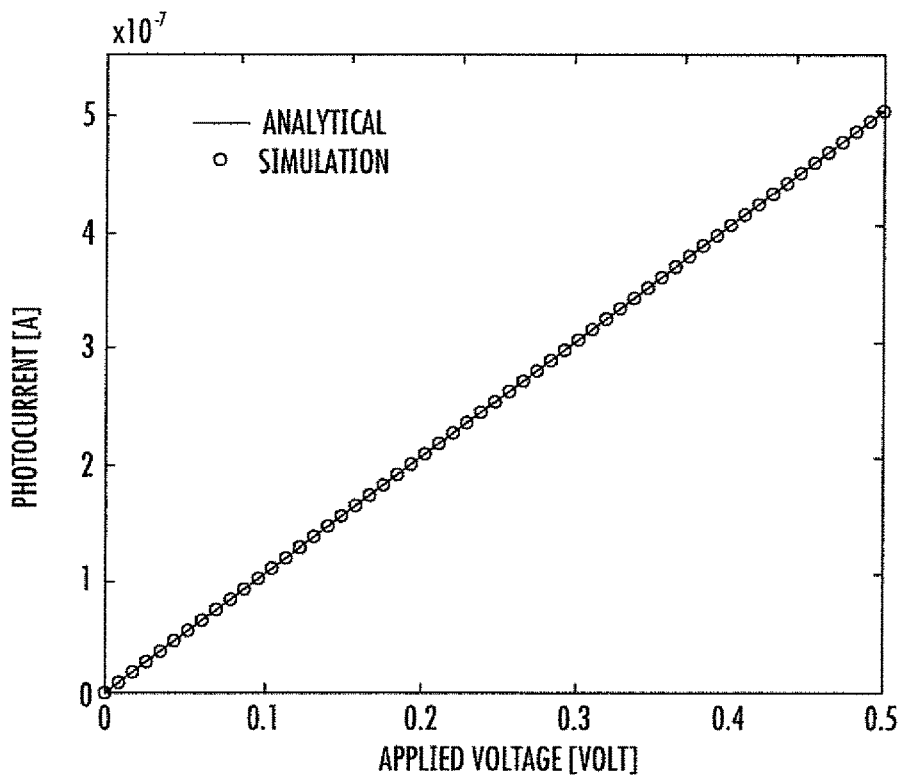

FIGS. 2A-2B presents the comparison between the results from simulation (line with symbols) and analytical calculation (solid line) for our microwire with a uniform p-type doping density of 10 $cm^{-3}$. FIG. 2A compares excess electron (minority carrier) density for different applied biases between the contacts. The photogenerated minority electron density is symmetric with respect to the contacts for zero bias, but the peak density shifts towards the positive (right) contact at position=6.8 μm) as the bias is increased. FIG. 2B plots the total current with one sun illumination as a function of the bias voltage in the range 0.0-0.5V. The plots display an excellent match between analytical calculations (solid line) and simulation results (symbol).

The device operation can be understood as follows. At dark and equilibrium, hole density (p) throughout the device is equal to the doping density ($10^{15}$ $cm^{-3}$) while electron density is $n_i^2/p$ or $2 \times 10^5$ $cm^{-3}$. The current is obviously zero as there is no drift (due to zero electric field) or diffusion (due to zero density gradient). When a bias is applied at dark, due to Ohmic contacts, a constant electric field is set up along the length of the device. Hence the carrier densities are still the same as in the equilibrium case so that the diffusion currents are zero. However, drift currents proportional to the electric field (and carrier densities) are produced under bias. Since electron density is negligible compared to the hole density, the total current equals the hole drift current.

Under an illumination, the microwire and nanowire photovoltaic devices absorb photons of energy higher than the bandgap that excite electrons from the valence band to the conduction band. This process generates excess electron-hole pairs. Note however that the excess carrier density is zero at the contacts due to requirement of boundary condition. Since at short circuit (or zero applied bias) the device is symmetric with respect to the contacts, the excess carrier density is symmetric dome shaped in this case, as shown in the red curve of FIG. 2A. This also implies a zero photo current at zero bias (zero drift) as excess carrier diffusions are equal and opposite. The excess carrier density is low for one sun illumination, so overall hole density is still dominated by the doping density. For electrons though the excess density is orders of magnitude higher than the equilibrium density, so FIG. 2A essentially plots the electron density under illumination. As the bias is increased, the applied electric field shifts the maximum excess carrier position towards the positive contact. In this case both drift and diffusion photo currents, and a nonzero total photo current, are produced. The present disclosure finds that the dark current for this device is too high because of the Ohmic contacts so that photocurrent to dark current ratio is close to unity.

Thus for Ohmic contacts, an asymmetric carrier profile due the applied bias causes nonzero (drift and diffusion) current as shown in FIG. 2B. In addition to applied bias, asymmetry can also be introduced by dissimilar doping of the wire ends as well as by unequal work function Schottky contacts as discussed in section 5. For nanodevices, it is difficult to control the doping [16-19], while use of unequal work function metal contacts is relatively easier. Such an approach is also common in organic photovoltaics. Hence, the present disclosure studies the effect of introducing asymmetry between the nanowire ends with dissimilar work functions on the photocurrent.

4. PHOTOCURRENT VERSUS WIRE LENGTH

In all results below, standard solar spectrum air mass 1.5 (AM1.5) has been used whenever light is present. The recombination processes considered here are Shockley-Read-Hall (SRH) and Auger recombination. Varying values of minority carrier lifetimes used in this work are assumed to include a range of bulk and surface recombination values.

Minority carrier lifetime is an important parameter for solar cell devices. Intuitively, the longer the wire, the more the surface area to absorb light and the larger will be the number of excess carriers generated inside for a single device and hence the larger the current. However, only carriers that reach the contact contribute to any photocurrent. The rest of the electron-hole pairs recombine inside the device. A longer lifetime gives minority carriers more time to travel to the contact before recombination with a majority carrier. On the other hand, if the lifetime is too short, excess minority carriers recombine with majority carriers before reaching the contact and as such will not contribute to the photocurrent. Thus, carrier lifetime sets a limit to the maximum wire length beyond which photo generated carriers are not collected efficiently and as a result the photocurrent saturates. Hence the wire lengths and minority carrier lifetimes are related. This is seen in the results shown in FIG. 3, which plots zero bias photocurrent (short circuit current) of the wires of varying lengths for minority carrier lifetimes of 10 μsec (solid curve), 1 μsec (dashed curve) and 0.1 μsec (dash-dotted curve). The present disclosure considered doping density of ~$10^{15}$ cm$^{-3}$(p-type) for which minority carrier lifetime in crystalline bulk silicon is larger than 10 μsec[20, 21]. However, due to large surface to volume ratio, nanowires can have high a surface recombination rate that can potentially reduce minority carrier lifetime [22,23]. Life time that is an order of magnitude shorter than that of bulk silicon has been reported [23]. There have also been studies to improve the surface recombination and increase the lifetime [24,25]. In view of these results, the lifetime values selected here are representative. Metal work functions of 5.5 eV (left contact) and 4.0 eV (right contact) have been used in this simulation.

Figure 3:
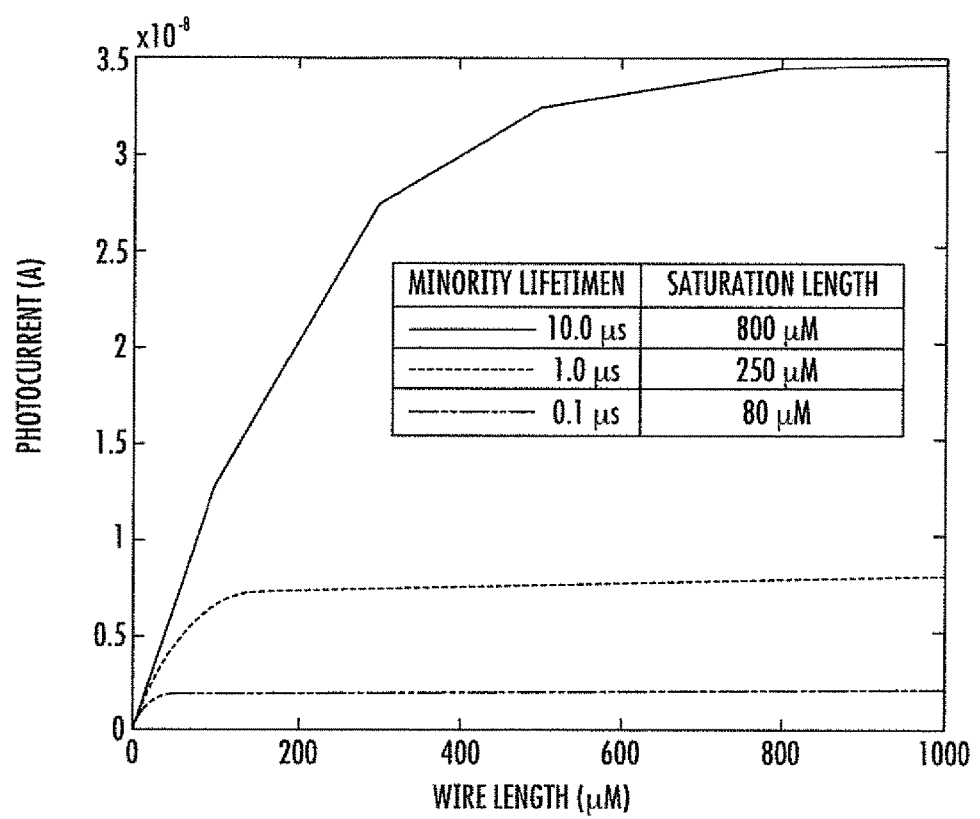

FIG. 3 inset tabulates the relationship between the minority carrier lifetime and the device length at which the photocurrent approximately saturates. The saturation length is approximately proportional to the square root of the lifetime. This is reasonable given that the minority carrier diffusion length is defined as L=$\sqrt{D\tau}$, where D=(kT/q)μ is the diffusion constant, μ is the carrier mobility, and τ is the lifetime. At 300K, L=50 μm for μ=1000 cm$^2$/V-sec and τ=1 μsec. For this case saturation length is about 250 μm. This relation holds for other lifetimes as well. Hence, the saturation length is about five times the minority carrier diffusion length. This may be a good design parameter for nanowire based solar cell.

5. EFFECT OF METAL WORK FUNCTION

As stated earlier, the results in FIG. 3 are for metal work function pair of 5.5 eV and 4.0 eV. This choice depends on the work function of usable metals and of course, the work function of the nanowire itself. The larger the difference between the two metal work functions, the larger the asymmetry, and the better the photovoltaic properties. However, in practice not all metal combinations may ideally be suitable. For example, both gold and platinum have high work functions, but they concomitantly also reduce the charge carrier lifetime [26,27] and thus may not be suitable as contact metals. On the low work function side, calcium and magnesium are highly reactive [28] and difficult to deposit since they oxidize very fast. Therefore for practical considerations, it is appropriate to study how lower work function differences affects solar cell behavior. Work function of the silicon nanowire can depend on many parameters such as etching time [29], chemical used in surface passivation, nanowire diameter [30], and doping. Silicon nanowire work function has been found to vary from about 4.5 eV to 5.01 eV [29,30]. Work function of silicon microwire is taken from the bulk silicon, which has an electron affinity of 4.17 eV. Therefore depending on doping type and concentration, the work function can vary from 4.17 eV (bottom of conduction band) to 5.25 eV (top of valence band) assuming a bandgap of 1.08 eV. In the present disclosure, it was mostly considered that the wire work function is 5.01 eV. This corresponds to bulk silicon with a p-type doping of ~$10^{15}$ cm$^{-3}$. As explained through FIGS. 4A-4D below, the work function of one metal should be below and that of the other metal should be above that value.

Thus, considering a wire work function of 5.01 eV and work function range of usable metals, metal work functions of 5.5 eV and 4.0 eV are reasonable choices in our work.

FIGS. 4A-4D shows the conduction band (solid line) and the valence band (dashed line) as well as the Fermi level (dash dotted line) for a 10 μm long wire. When there is no metal work function difference (FIG. 4A), the two contacts are identical. If light is incident uniformly on such a device both the photocurrent and the photovoltage will be zero due to the symmetry of the bands.

Figure 4B:
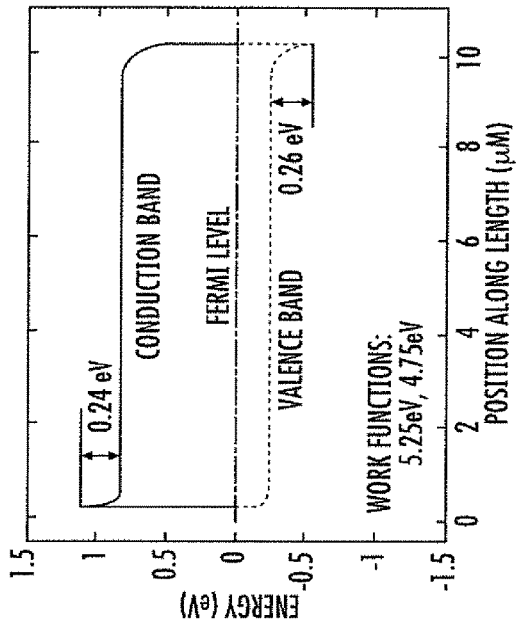
FIGS. 4A-4D are diagrams of work functions in varying embodiments of the photodetector cell of FIG. 1A.
Figure 4D:
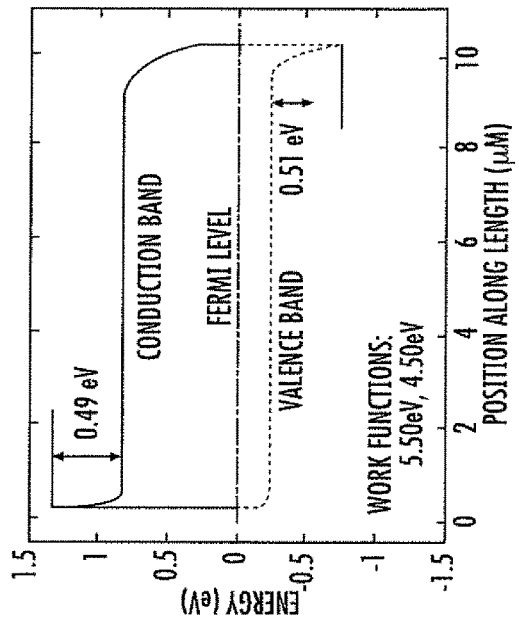
Figure 4A:
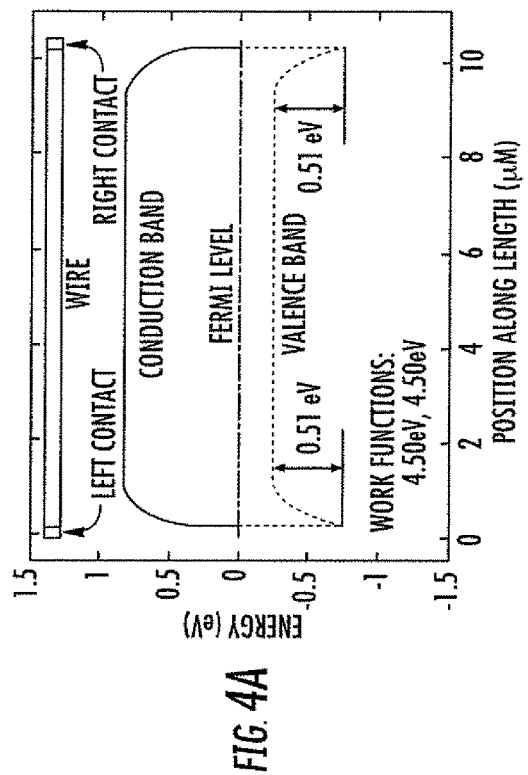
Figure 4C:
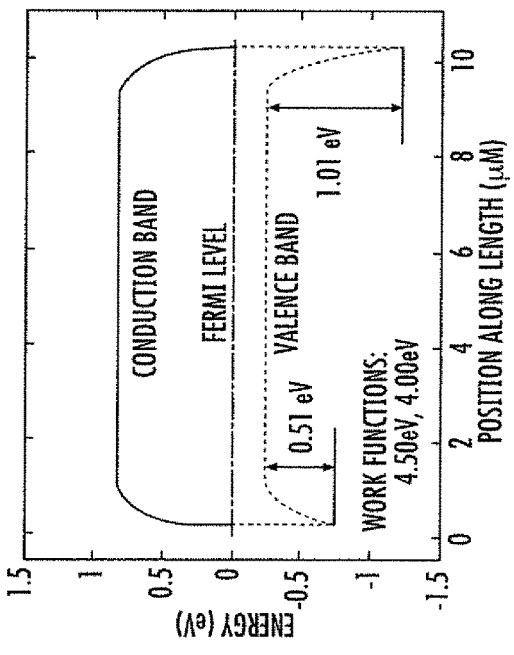

FIG. 4B shows the case with work function of 5.25 eV for left contact (larger than silicon work function) and 4.75 eV right contact (less than silicon work function). Here electrons will prefer to flow towards the right contact while holes towards the left, resulting in a net photocurrent. If the barrier to the electron (hole) flow on the left (right) side is increased, photocurrent will also increase (FIG. 4C). This is described in more detail in relation to FIGS. 8A-8B below. If the work functions are chosen in such a way that bands at both ends bend in the same direction (FIG. 4D), relatively smaller photocurrent will be produced and the device will be inefficient. Section 5 discusses guideline for choosing the metal work functions for improved short circuit current and open circuit voltage. It is also to be noticed that although the band bending in FIGS. 4A-4D is affected by proper metal work function selection, controlled doping may also produce similar effects.

Figure 5A:
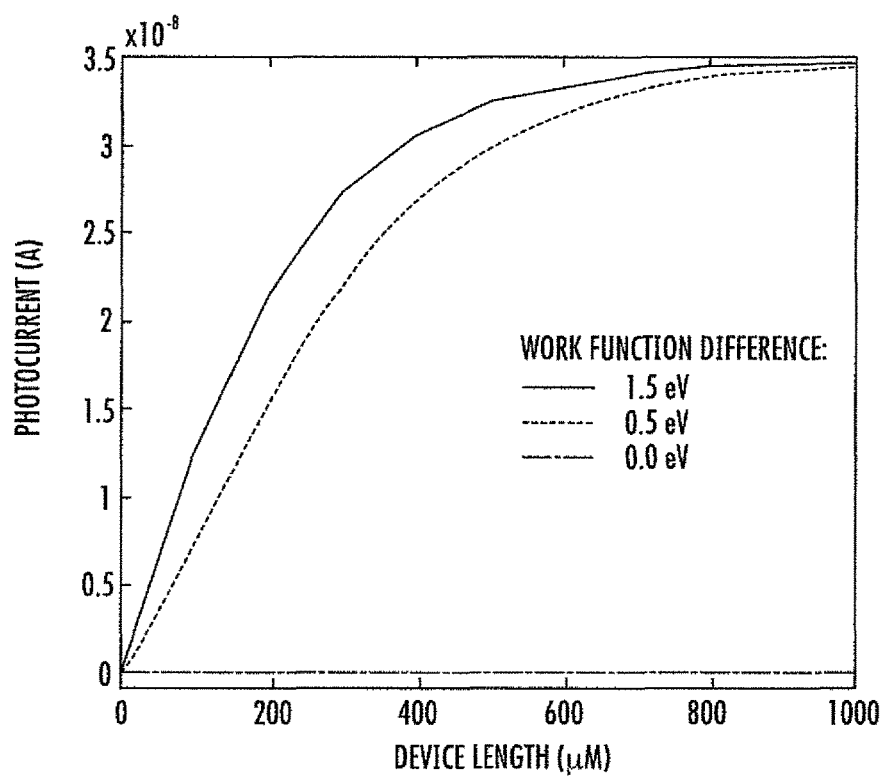

To see the effect of the work function difference on the photocurrent, the present disclosure has plotted the short circuit photocurrent of the microwire device (width=1 μm and height=35 nm) as function of its length in FIG. 5A. There are three curves for three metal contact work function differences. For a work function difference of 0.0 eV (dash dotted line), the current is zero, as can be expected from FIG. 4A. For a moderate work function difference of 0.5 eV (dashed line), there is a considerable amount of photocurrent. This should be expected from the band diagram of FIG. 4B. For a large work function difference of 1.5 eV (solid line), the current is even larger (see FIG. 4C), especially before saturation occurs at very long lengths. So the photocurrent increases with the work function difference.

Figure 5B:
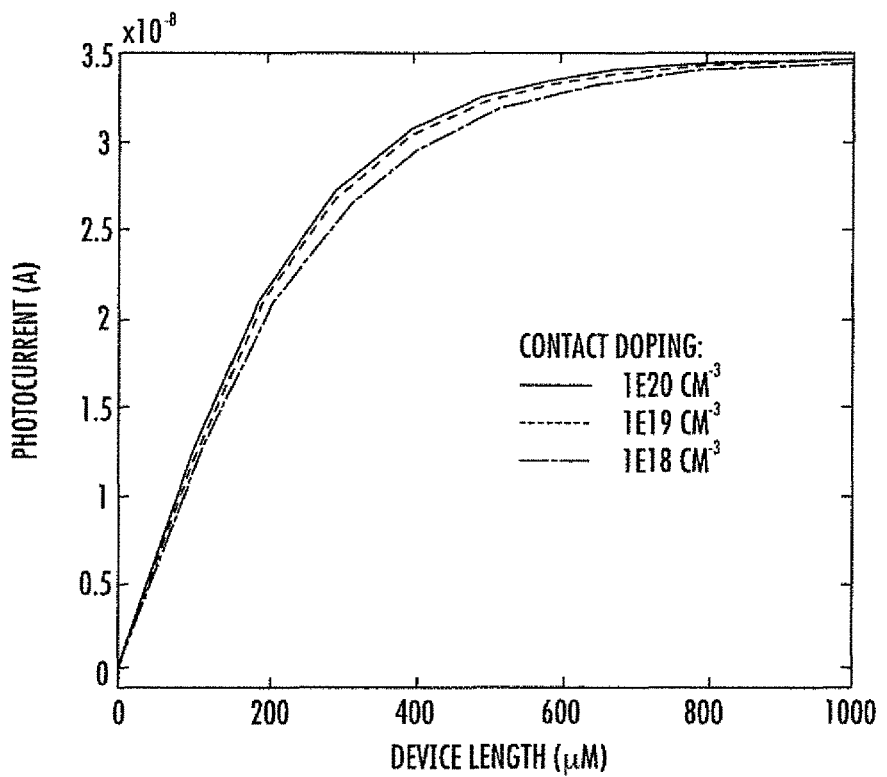

Another aspect to consider is to compare the effect of dissimilar doping at the ends of a wire with the effect of work function difference of the metal pairs. FIG. 5B plots the short circuit photocurrent of the same wire as in FIG. 5A for three different doping concentrations ($10^{18}$ cm$^{-3}$ (dash dotted line), $10^{19}$ cm$^{-3}$ (dashed line), $10^{20}$ cm$^{-3}$ (solid line)). Comparison of FIGS. 5A and 5B reveals that metals with work function difference of 1.5 eV (work functions of 4.0 eV and 5.5 eV, solid line in FIG. 5A) can give the same short circuit photocurrent as that produced by doping concentrations equal to or in excess of $10^{19}$ cm$^{-3}$ (FIG. 5B, which makes the use of dissimilar metals an attractive alternative since controlled doping in nanowires is difficult [16-19]).

6. SHORT-CIRCUIT CURRENT AND OPEN-CIRCUIT VOLTAGE

Figure 6A:
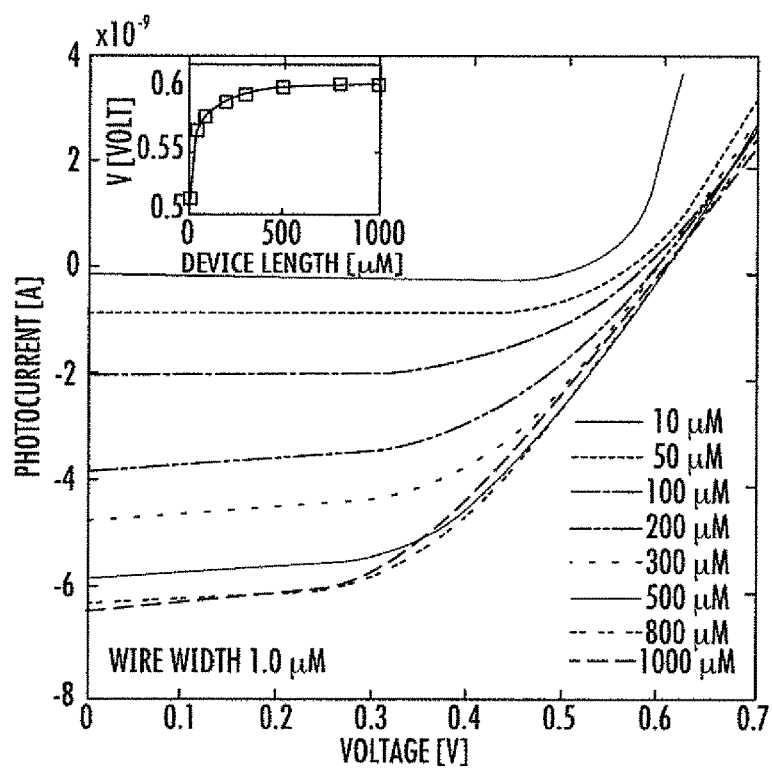
Figure 6B:
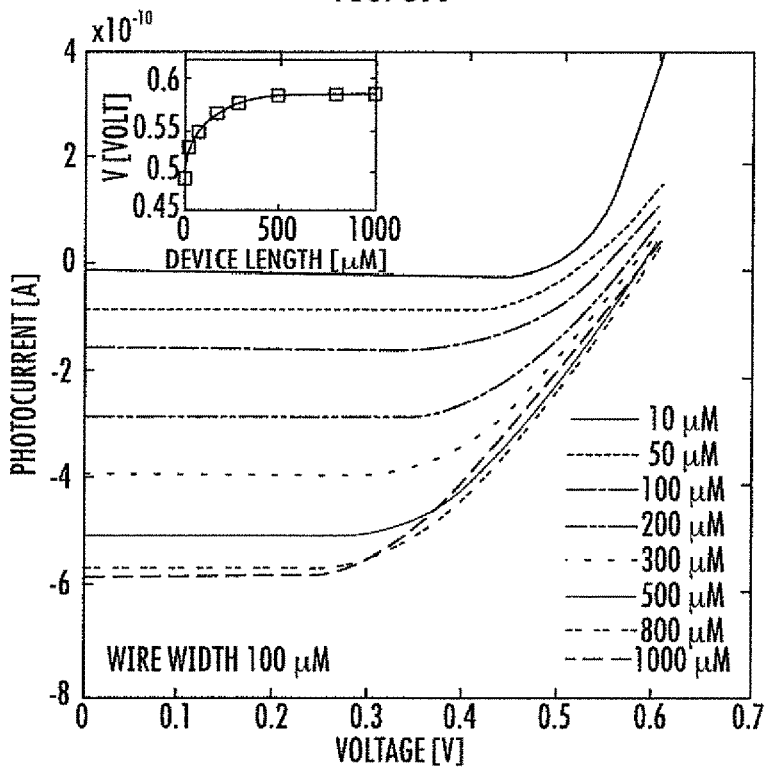

Short-circuit current and open-circuit voltages are among the most important performance parameters of a solar cell. Short-circuit current ($I_{sc}$) is simply the photocurrent when the two electrodes are shorted to each other. Open-circuit voltage ($V_{oc}$) is the voltage across the device when the electrodes are open. In FIGS. 6A-6B, both $I_{sc}$ and $V_{oc}$ of wires of two different widths: 1 μm (a) and 100 nm (b) are considered. The lengths of the wires vary from 1 μm to 1000 μm. Each wire has a height of 35 nm. The metal work functions are 5.15 eV (Nickel) and 4.15 eV (Aluminum). FIG. 6A plots the 2D simulation results for the 1 μm wide wire. Note that 2D simulation is done on a vertical cross section of area L times H of the wire (FIG. 1A). Since the height of the wire is still thin (35 nm), the present disclosure includes the more computationally costly 3D simulation for this device (results not shown here). The present applicants have found that although the 2D and 3D results in our work have a close match, compared to 3D, the 2D simulations does tend to slightly overestimate both the 4, and $V_{oc}$. Thus, for the narrower wires, only 3D (FIG. 6B) simulations were done. $I_{sc}$ for the 1 μm wide wire is about 10 times that of the 100 nm wide wire. Indeed, from 3D simulation of the wider wire, it is found that the current scales exactly linearly with the wire width. There have been several simulation studies [31-34] on optical absorption of single and multiple silicon nanowires as function of their diameter. Most works are on arrays of vertical wires [34] with core-shell geometry [31]. Simulations of core-shell single cylindrical wire predict [31] that there is an optimal wire radius for maximum current density. It was also pointed out that simulation of single nanowire may not capture all the physics present in an array of wires. Current per unit area was found to increase while current per unit volume was found to decrease with wire diameter in a study [34] of horizontal hexagonal wires. Simulation study [32] of arrays of cylindrical wires lying horizontally on a flat surface with wire to wire distance of 200 nm predicts enhanced absorption with increasing diameter, ranging from 50 to 160 nm. Our result is consistent with that study. For our single rectangular wire, lying horizontally on a flat surface, the surface area over which normal light is incident upon it is exactly proportional to its width. Thus the photocurrent generated by absorption of a uniform intensity light is proportional to the wire width.

For both cases, the $I_{sc}$ first increases and then saturates with length. This is because as length increases, the probability of recombination of excess charge carriers also increases as they move towards their respective contacts. $V_{oc}$, as shown in the inset of FIGS. 6A-6B, has a trend similar to that of $I_{sc}$. This length is 800 μm for both $I_{sc}$ and $V_{oc}$ for minority carrier lifetime of 10 μs.

The behavior of $V_{oc}$ can be understood in terms of quasi-Fermi level splitting under illumination [35,36]:

$$V_{OC} = \frac{kT}{q}\ln\left(\frac{np}{n_i^2}\right) \square \frac{kT}{q}\ln\left(\frac{\Delta n(N_A+\Delta p)}{n_i^2}\right) \quad (5)$$

where n (p) is the electron (hole) density, $N_A$ is the p-type doping density, $\Delta n(\Delta p)$ is the excess electron (hole) density due to illumination and $n_i$ is the intrinsic carrier density. Similar expression holds for n-type doping. If the device is very long such that in steady state the excess carrier densities approach the value $G_L t$, then Eq. (5) becomes, $$V_{OC} \square \frac{kT}{q}\ln\left(\frac{(G_L\tau)(N_A+(G_L\tau))}{n_i^2}\right) \quad (6)$$

Figure 7:
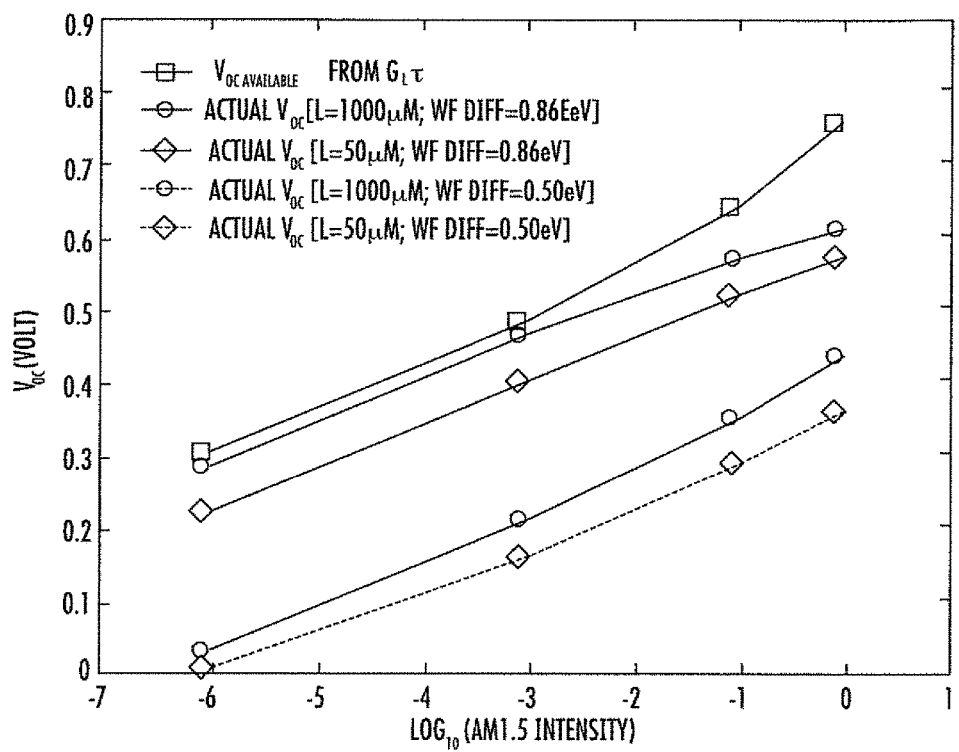

Eq. (6) gives a limit on the available $V_{oc}$. In an actual device, the closer the average excess densities are to $G_L t$, the closer its $V_{oc}$ will reach the value given by Eq. (6). FIG. 7 plots available as well as actual $V_{oc}$ as a function of the AM1.5 light intensity for different wire lengths and two different work function differences between the Schottky contact and the wire. Long wire with large work function difference approach the ideal device as can be seen for the case of 1000 μm long wire with work function difference of 0.86 eV. For shorter wire (50 μm), with the same work function difference, the voltage is lower. The reason is that the shorter the wire the lower its excess carrier density is compared to $G_1\tau$.

Since appropriate contact work function values are important for the nanowire solar cells, the present disclosure discusses below how one may select the work functions to get larger $I_{sc}$ and $V_{oc}$. The wire considered is 100 μm long, 1 μm wide and 35 nm thick. The p-type doping density of the wire is $10^5$ cm$^{-3}$ so that the Fermi level is fixed at 5.01 eV below the vacuum level (conduction band is at 4.17 eV and valence band is at 5.25 eV below). As discussed in FIGS. 4A-4D, in this case, work function of the Ohmic contact ($W_o$) should be below and the work function of the Schottky contact ($W_s$) should be above, the wire equilibrium Fermi level.

Figure 8A:
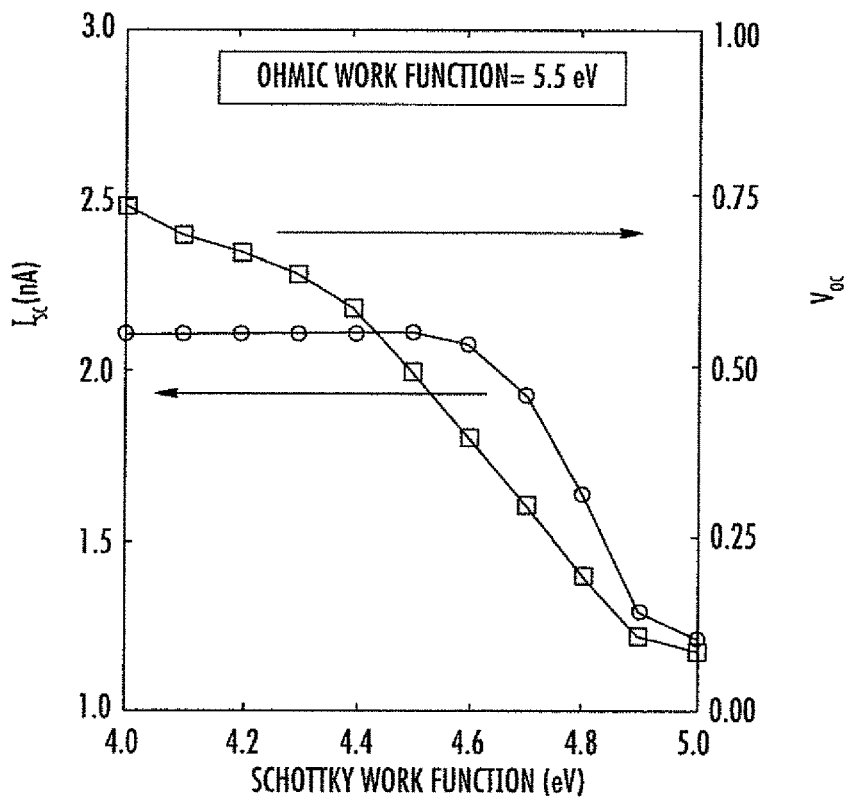
FIGS. 8A-8B are diagrams of Schottky work function contacts and Ohmic work function contacts, respectively, in the photodetector cell of FIG. 1A.
Figure 8B:
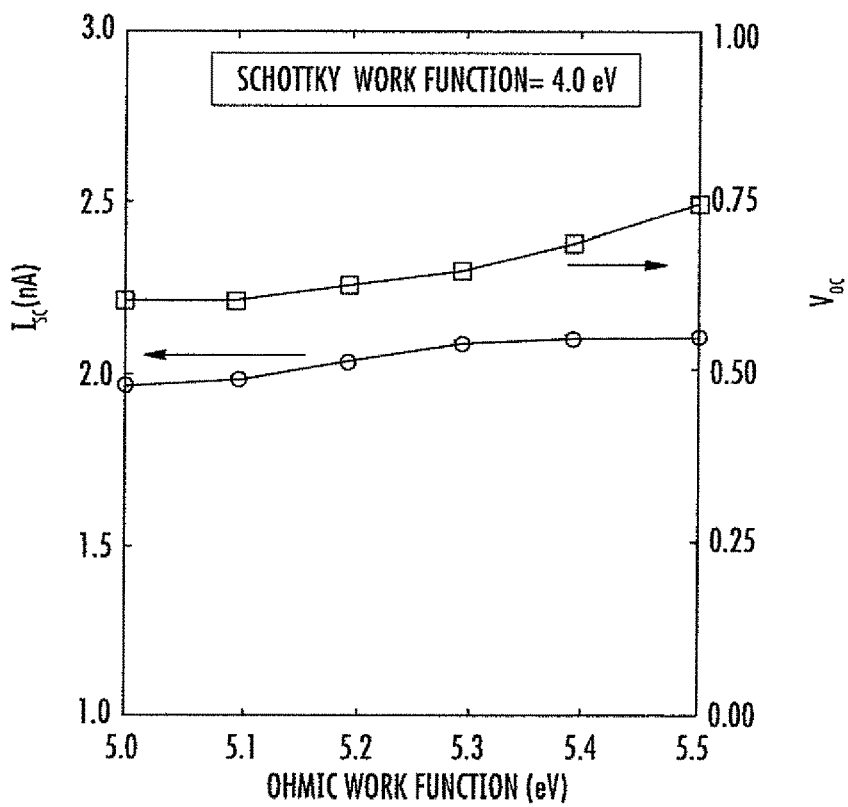

FIG. 8A plots $I_{sc}$ and $V_{oc}$ as a function of the $W_s$ with $W_o$ kept fixed at 5.5 eV while in FIG. 8B the $W_s$ is fixed at 4.0 eV and $W_o$ changes. As $W_s$ moves above and away from the wire work function (FIG. 8A), both $I_{sc}$ and $V_{oc}$ increase rapidly. But $I_{sc}$ saturates when $W_s$ is about 0.5 eV above the wire work function, while $V_{oc}$ keeps increasing at a slower rate. On the other hand, variation in $W_o$ (with a fixed $W_s$) does not produce as high a change in both the open circuit voltage and short circuit current (FIG. 8B). The present disclosure finds that $I_{sc}$ saturates when $W_o$ is 0.4 eV below the wire work function. Thus for efficient solar cell the work function of the Schottky contact is very important and should be as far away from the wire's work function as possible. The work function of the Ohmic contact although less important, can still cause a noticeable change in the $V_{oc}$, which should be kept in mind when selecting the metal.

7. SHORT-CIRCUIT CURRENT DENSITY

The present disclosure has so far considered the total currents of the individual devices (microwire and nanowire) without regard for their surface areas. Since the amount of device area exposed to light is very important for solar cells, the present disclosure defines a short circuit current density as $$J_{SC} = \frac{I_{SC}}{LW} \quad (7)$$

where $I_{sc}$ is the total short circuit current and $J_{sc}$ is the short circuit current density. L and W are wire length and width, respectively. Note that this definition is different from short circuit current density used in conventional planar solar cells where the current flows perpendicular to the surface area. For the horizontally lying wires considered in this present disclosure, the area in Eq. (7) is the area exposed to light (FIG. 1A), and the current flows parallel to this area.

Figure 9:
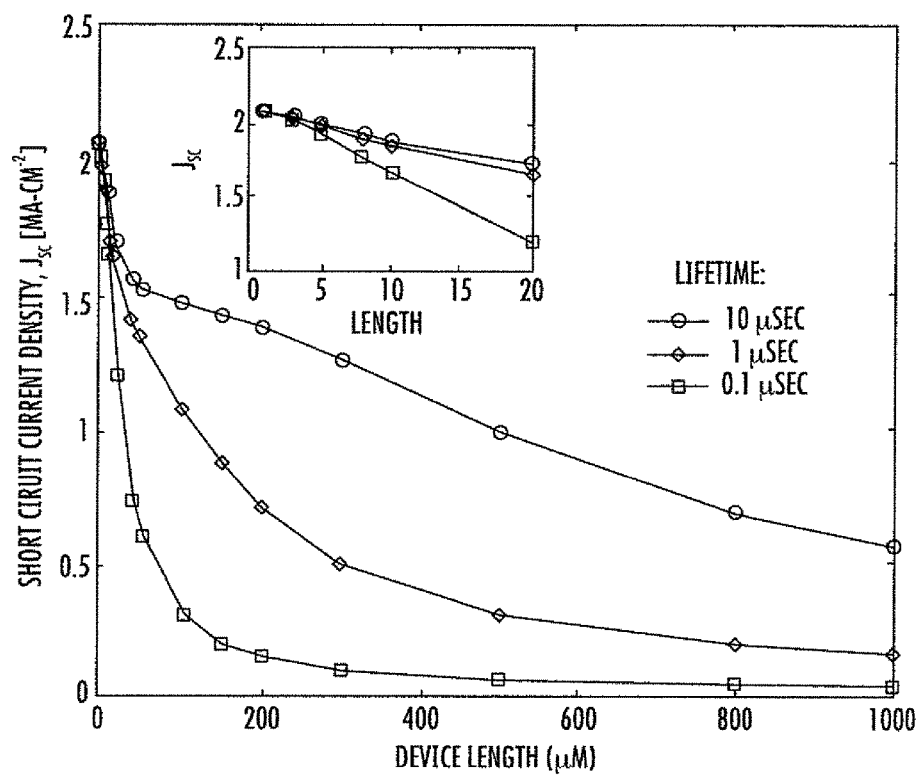

The present disclosure includes a plot of the short circuit current density ($J_{sc}$) for both the microwire and the nanowire devices for three different representative minority carrier lifetimes in FIG. 9. In this plot, surface areas of the two metal contacts at the ends of the wire have not been taken into account. For a particular minority carrier lifetime, $J_{sc}$ for both microwire and nanowire are the same, and thus $I_{sc}$ scales with wire surface area, as discussed in relation to FIGS. 6A-6B. $J_{sc}$ decreases as wire length increases, and the shorter the lifetime the faster the decrease. The reason is again attributed to the increased inefficient collection of photogenerated carriers as the length increases.

As seen in FIG. 3, the $I_{sc}$ for a wire saturates at 5 times the diffusion length. However, when the surface area is taken into account, the carrier collection efficiency decreases rapidly with length. This implies that to obtain large current density per surface area, shorter wires are preferable. However for greater current per nanowire, longer wires are preferable.

8. COMPARISON WITH REPORTED EXPERIMENTAL RESULTS

Kelzenberg et al. [12] measured both $V_{oc}$ and $J_{sc}$ for single silicon nanowires of diameter 900 nm and length 20 µm and it is interesting to compare our predictions with their measurements. However, there is one important difference. The reported work uses aluminum for both contacts, where one contact is electrically heated to get Schottky effect. Our work considers specific work functions corresponding to two distinct metals. The present disclosure provides a simulation of a wire of the same dimension with a minority carrier lifetime of 15 nsec, as given in [12]. For aluminum, the work function is approximately 4.15 eV. However, the work function of heated aluminum-silicon interface is not well understood [12] and the exact value is not available. Here a value of 4.52 eV gives a good match with experiment. The present disclosure finds $V_{oc}$ of 0.193V and $J_{sc}$ of 4.2 mA/cm$^2$, which are comparable to 0.19V and 5 mA/cm$^2$, respectively.

9. IMPROVING SHORT CIRCUIT CURRENT

For long wires, saturation of short circuit current is a drawback. However, it is possible to make an improvement with modifications. So far, the present disclosure has considered contacts only at the ends of the wire. FIG. 10 depicts a sketch of a wire with additional metal contacts placed between the two ends. This contact arrangement essentially breaks a long wire into a few short nanowires electrically, with the cathodes connected together and the anodes connected together. This causes collection efficiency to increase since electrons and holes have to travel shorter distances.

Figure 11B:
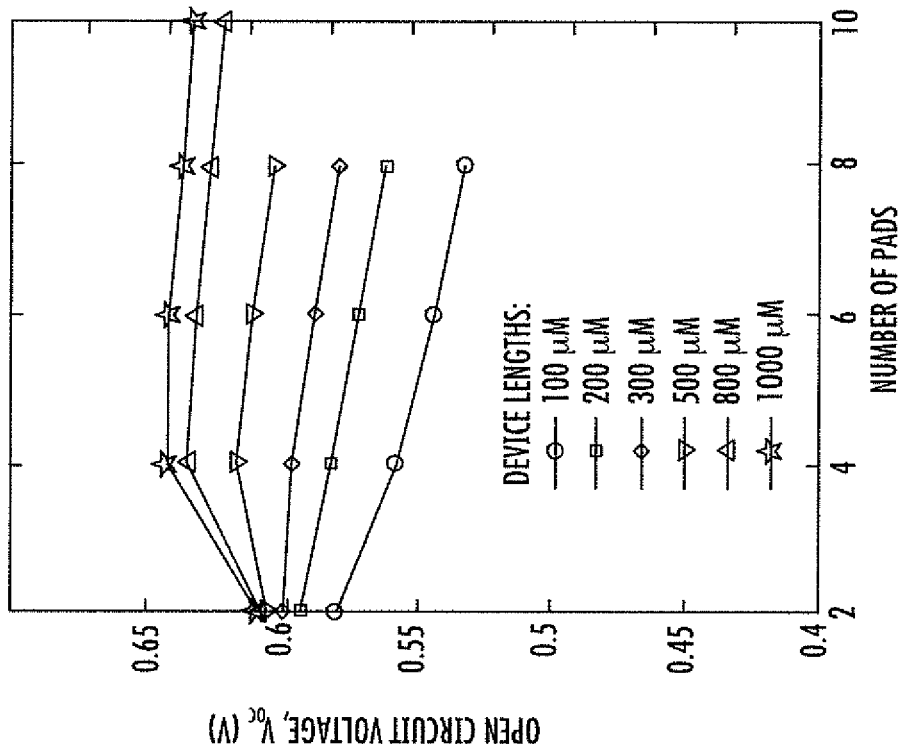
FIGS. 11A-11B are diagrams of short circuit current and open circuit voltage, respectively, in the photodetector cell of FIG. 1A.
Figure 11A:
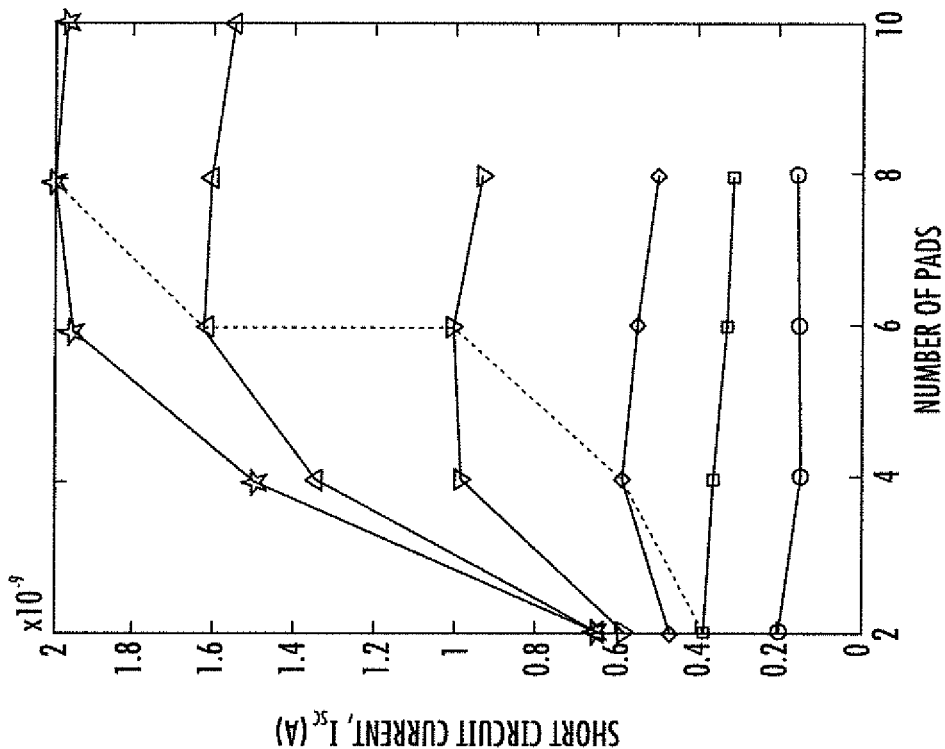

FIGS. 11A-11B plots both $I_{sc}$ (a) and $V_{oc}$ (b) versus the number of pads for nanowires of 6 different lengths. Here a minority carrier lifetime of 10 µs has been considered. For lengths below 220 µm, more than two pads decrease the current (FIG. 11B). But for lengths 220 µm and above, maximum current is obtained when more than two pads are used. The results in FIG. 11A potentially imply that for wires with shorter lifetimes (more defects) employing multiple pads will improve collection efficiency even at shorter lengths. In addition, there is an improvement in fill factor (not shown) when number of pads equal or exceed the number required for maximum current. The $V_{oc}$ vs number of pads plot in FIG. 11B indicates that for wire length of 500 µm or larger, open circuit voltage is greater for more than two pads. For number of pads maximizing the short circuit current (FIG. 11B), $V_{oc}$ is still larger than its value with two pads, if length is 500 µm or larger.

Electrically connecting silicon wires in series or parallel can be done using current technology. A long silicon wire that is electrically broken by an interdigitated electrode pattern, as discussed above, may be thought of as a series connection of many smaller wires. The fabrication of millimeter long silicon nanowires has been reported some time back [37-40]. Electrode pattering for the long wires follows well defined fabrication procedures. On the other hand, arrays of silicon nanowires between two electrodes can be viewed as a parallel connection of those nanowires. Such arrays (or mats) have demonstrated optical properties that make them attractive candidates for solar cells, such as enhanced optical absorption [41].

10. CONCLUSION

Nano and microwire photovoltaic devices have been investigated. The use of two dissimilar metals contacts, with dissimilar work functions, for these devices is seen to be an excellent alternative to dissimilar doping at the two ends of the wire. This implies that issues related to fabrication reliability of such devices can be significantly reduced because controlled doping in nanowires is difficult and expensive. The behavior of nanowire photovoltaic devices is found to be dependent on the wire length for short wires. However for longer wires, both the short circuit current and open circuit voltage saturate. This saturation length is found to be approximately five times the minority charge carrier diffusion length, and suggests an upper bound on the achievable photocurrent. This bound can be overcome through modifications of the basic structure. Use of interdigitated patterns of dissimilar metals for a very long wire is seen to significantly increase the short circuit current, while keeping the open circuit voltage nearly constant. This is attributed to increased collection of charge carriers before they recombine.

APPENDIX A. SIMULATION METHOD, DEVICE EQUATIONS, VARIABLES AND CONSTANTS

Modeling studies of the structure are carried out Silvaco Atlas software [14]. In this simulator the device structure (FIG. 1A) is meshed, and device equations (see below) are discretized and solved on device mesh points with appropriate boundary conditions. For device meshing, a wire (device) with given L, W, and H is taken. The wire is covered by a 1 nm thick silicon dioxide on all surfaces. Usually a constant doping of given type and amount is assumed at all the grid points. However, for simulations involving the p-i-n type structure, there are three different regions, each with a different but still uniform doping density. The nanowire is contacted with two or more electrodes. A metal of a specific work function forms an electrode. Wherever there is an electrode, the oxide at the surface of the wire is removed so that the metal is in direct contact with the silicon. The device (nanowire+oxide+electrodes) is meshed (discretized) using prism elements along all three directions for a three dimensional (3D) simulation. For a two dimensional (2D) simulation, a vertical cross section of the metal-wire-metal structure is discretized using triangular elements. Silvaco Atlas solves the following equations on the device mesh:

Poisson's equation $$\nabla \cdot (\varepsilon_r \varepsilon_o \nabla \psi) = -q(p-n) \quad \text{(A.1)}$$

Carrier continuity equation $$\frac{1}{q} \nabla \cdot \vec{J}_n + G_n - R_n = 0 \quad \text{(A.2a)}$$

-continued $$-\frac{1}{q}\nabla \cdot \vec{J}_p + G_p - R_p = 0 \tag{A.2b}$$

Drift-diffusion transport equation $$\vec{J}_n = -q\mu_n n \nabla \phi_n \tag{A.3a}$$

$$\vec{J}_p = -q\mu_p p \nabla \phi_p \tag{A.3b}$$

Quasi-Fermi levels $$\phi_n = \psi - \frac{k_B T}{q}\ln\left(\frac{n}{n_i}\right) \tag{A.4a}$$

$$\phi_p = \psi + \frac{k_B T}{q}\ln\left(\frac{p}{n_i}\right) \tag{A.4b}$$

Carrier recombination $$R_{SRH} = \frac{pn - n_i^2}{\tau_p(n + n_i) + \tau_n(p + n_i)} \tag{A.5a}$$

$$R_{AUG} = \Gamma_n(pn - nn_i^2) + \Gamma_p(np^2 - pn_i^2) \tag{A.5b}$$

Light absorption and photo generation $$G_n = G_p = G_L = \eta_0 \frac{P\lambda}{hc}\left(\frac{4\pi}{\lambda}k\right)\exp\left(-\left(\frac{4\pi}{\lambda}k\right)y\right) \tag{A.6}$$

TABLE A.I

List of variables

| Symbol | Name | Symbol | Name |
|---|---|---|---|
| $\Psi$ | Electric potential | $n_S$ | Surface electron density from charge neutrality |
| n | Electron density | $p_S$ | Surface hole density from charge neutrality |
| p | Hole density | $\mu_n$ | Electron mobility |
| $\vec{J}_n$ | Electron current density | $\mu_p$ | Hole mobility |
| $\vec{J}_p$ | Hole current density | $\phi_n$ | Electron quasi-Fermi level |
| $G_n$ | Electron generation rate | $\phi_p$ | Hole quasi-Fermi level |
| $G_p$ | Hole generation rate | $\tau_n$ | Minority electron lifetime |
| $G_L$ | Photo generation rate | $\tau_p$ | Minority hole lifetime |
| $R_n$ | Electron recombination rate | P | Ray intensity factor, includes effects of reflections, transmission and absorption |
| $R_p$ | Hole recombination rate | k | Imaginary part of index of refraction |
| $V_{applied}$ | Applied bias | $\lambda$ | Wavelength of light |
| $W_f$ | Metal work function | $\varepsilon_r$ | Relative permittivity |

TABLE A.II

List of constants

| Constant | Name | Value |
|---|---|---|
| $\varepsilon_0$ | Permittivity in vacuum | $8.854 \times 10^{-14}$ F · cm$^{-2}$ |
| q | Magnitude of electron charge | $1.6022 \times 10^{-19}$ C |
| $n_i$ | Intrinsic carrier density | $1.45 \times 10^{10}$ cm$^{-3}$ |
| $\mu_n$ | Electron mobility | 1000 cm$^2$V$^{-1}$s$^{-1}$ |
| $\mu_p$ | Hole mobility | 500 cm$^2$V$^{-1}$s$^{-1}$ |
| $k_B$ | Boltzmann's constant | $1.38 \times 10^{-23}$ JK$^{-1}$ |

TABLE A.II-continued

List of constants

| Constant | Name | Value |
|---|---|---|
| T | Temperature | 300 K |
| $\Gamma_n$ | Electron Auger recombination parameter | $2.8 \times 10^{-31}$ cm$^6$s$^{-1}$ |
| $\Gamma_p$ | Hole Auger recombination parameter | $9.9 \times 10^{-32}$ cm$^6$s$^{-1}$ |
| h | Planck's constant | $6.626 \times 10^{-34}$ m$^2$ · kg · s$^{-1}$ |
| c | Speed of light in vacuum | $3 \times 10^{10}$ cm · s$^{-1}$ |
| $E_g$ | Silicon bandgap energy | 1.08 eV |
| $\chi$ | Electron affinity | 4.17 eV |
| $N_C$ | Electron effective density of states | $2.8 \times 10^{19}$ cm$^{-3}$ |
| $N_V$ | Hole effective density of states | $1.04 \times 10^{19}$ cm$^{-3}$ |

The symbols for variables and constants are defined in Table A.I and A.II, respectively. Relative permittivity for silicon is 11.8.

There are two types of surfaces in the device: with contact and without contact. A contacted surface can be either Ohmic or Schottky. Ohmic contacts are implemented as simple Dirichlet boundary conditions with $$\psi_s = \phi_n + \frac{k_B T}{q}\ln\frac{n_S}{n_i} = \phi_p - \frac{k_B T}{q}\ln\frac{p_S}{n_i} \tag{A.7}$$

while each Schottky contact is specified with an associated work function so that $$\psi_S = \chi + \frac{E_g}{2q} + \frac{k_B T}{2q}\ln\frac{N_C}{N_V} - W_f + V_{applied} \tag{A.8}$$

In the non-contacted surfaces, homogeneous (reflecting) Neumann boundary conditions are imposed and the normal electric field components are assumed zero in such surfaces. For a specific light condition, ray-tracing method is used to find the photo generation rate using Eq. (A.6). Next Poisson's equation and the current continuity equations (along with drift-diffusion equations) are solved self-consistently. At the beginning, an initial guess is found by the solution at equilibrium. In this case current continuity equations need not be solved, and only Eqs. (A.1) and (A.4) are solved to find potential and carrier densities inside the device. Once an initial guess has been obtained, the applied bias at the anode contact is increased in small increments (0.01V or 0.1V). The cathode bias is fixed at zero Volts. For each anode bias condition, the density values at the previous bias are used as an initial guess, and Poisson's equation is solved to calculate the device potential. The calculated potential is used in Eq. (A.4) to find the quasi-Fermi levels, which along the previous densities are substituted in Eq. (A.3) to find the current densities in terms of carrier densities. Finally the current continuity equations are solved to find the updated carrier densities. The updated densities are substituted in Eq. (A.1) to find the updated potential. If the updated and previous potentials match within a tolerance, the simulation for current bias has converged and the applied bias is increased to the next value. If the tolerance has not been achieved, the process (calculation of densities and potential) is repeated.

The present disclosure studies solar cell properties of single silicon wires connected at their ends to two dissimilar metals of different work functions. Effects of wire dimensions, the work functions of the metals, and minority carrier lifetimes on short circuit current as well as open circuit voltage are studied. The most efficient photovoltaic behavior is found to occur when one metal makes a Schottky contact with the wire, and the other makes an Ohmic contact. As wire length increases, both short circuit current and open circuit voltage increase before saturation occurs. Depending on the work function difference between the metals and the wire dimensions, the saturation length increases by approximately an order of magnitude with a two order magnitude increase in minority carrier length. However current per surface area exposed to light is found to decrease rapidly with increase in length. The use of a multi-contact interdigitated design for long wires is investigated to increase the photovoltaic response of the devices.

REFERENCES

[1] G. Larrieu, X.-L. Han, Vertical nanowire array-based field effect transistors for ultimate scaling, Nanoscale. 5 (2013) 2437-2441.
[2] J.-P. Colinge, C.-W. Lee, A. Afzalian, N. D. Akhavan, R. Yan, I. Ferain, et al., Nanowire transistors without junctions, Nat. Nanotechnol. 5 (2010) 225-229.
[3] I. Park, Z. Li, A. P. Pisano, R. S. Williams, Top-down fabricated silicon nanowire sensors for real-time chemical detection, Nanotechnology. 21 (2010) 015501.
[4] G. Zheng, F. Patolsky, Y. Cui, W. U. Wang, C. M. Lieber, Multiplexed electrical detection of cancer markers with nanowire sensor arrays, Nat. Biotechnol. 23 (2005) 1294-1301.
[5] E. Garnett, P. Yang, Light trapping in silicon nanowire solar cells, Nano Lett. 10 (2010) 1082-1087.
[6] M. M. Adachi, M. P. Anantram, K. S. Karim, Core-shell silicon nanowire solar cells, Sci. Rep. 3 (2013) 1546.
[7] Y. Cui, J. Wang, S. R. Plissard, A. Cavalli, T. T. T. Vu, R. P. J. van Veldhoven, et al., Efficiency enhancement of InP nanowire solar cells by surface cleaning, Nano Lett. 13 (2013) 4113-4117.
[8] L. Tsakalakos, J. Balch, J. Fronheiser, B. a. Korevaar, O. Sulima, J. Rand, Silicon nanowire solar cells, Appl. Phys. Lett. 91 (2007) 233117.
[9] V. Sivakov, G. Andra, A. Gawlik, A. Berger, J. Plentz, F. Falk, et al., Silicon Nanowire-Based Solar Cells on Glass: Synthesis, Optical Properties, and Cell Parameters, Nano Lett. 9 (2009) 1549-1554.
[10] B. Tian, X. Zheng, T. J. Kempa, Y. Fang, N. Yu, G. Yu, et al., Coaxial silicon nanowires as solar cells and nanoelectronic power sources, Nature. 449 (2007) 885-890.
[11] J. Kim, J.-H. Yun, C.-S. Han, Y. J. Cho, J. Park, Y. C. Park, Multiple silicon nanowires-embedded Schottky solar cell, Appl. Phys. Lett. 95 (2009) 143112.
[12] M. D. Kelzenberg, D. B. Turner-Evans, B. M. Kayes, M. a Filler, M. C. Putnam, N. S. Lewis, et al., Photovoltaic measurements in single-nanowire silicon solar cells, Nano Lett. 8 (2008) 710-714.
[13] F. Zhang, T. Song, B. Sun, Conjugated polymer-silicon nanowire array hybrid Schottky diode for solar cell application, Nanotechnology. 23 (2012) 194006.
[14] Atlas, Silvaco. Available: http://www.silvaco.com, (2014).
[15] R. F. Pierret, Modular series on solid state devices: Volume I: Semiconductor Fundamental, Addison-Wesley publishing company, 1983.
[16] P. Peercy, The drive to miniaturization, Nature. 406 (2000) 1023-1026.
[17] C. Claeys, Technological Challenges of Advanced CMOS Processing and Their Impact on Design Aspects, Proc. 17th Int. Conf. VLSI Des. (2004) 275.
[18] S. Xiong, J. Bokor, Structural Optimization of SUT-BDG Devices for Low-Power Applications, IEEE Trans. Electron Devices. 52 (2005) 360-366.
[19] E. C. Jones, E. Ishida, Shallow junction doping technologies for ULSI, Mater. Sci. Eng. R Reports. 24 (1998) 1-80.
[20] J. a. del Alamo, R. M. Swanson, Modelling of minority-carrier transport in heavily doped silicon emitters, Solid. State. Electron. 30 (1987) 1127-1136.
[21] M. S. Tyagi, R. Van Overstraeten, Minority carrier recombination in heavily-doped silicon, Solid. State. Electron. 26 (1983) 577-597.
[22] J. E. Allen, E. R. Hemesath, D. E. Perea, J. L. Lensch-Falk, Z. Y. Li, F. Yin, et al., High-resolution detection of Au catalyst atoms in Si nanowires, Nat. Nanotechnol. 3 (2008) 168-173.
[23] Y. Jung, A. Vacic, D. E. Perea, S. T. Picraux, M. a. Reed, Minority Carrier Lifetimes and Surface Effects in VLS-Grown Axial p-n Junction Silicon Nanowires, Adv. Mater. 23 (2011) 4306-4311.
[24] Y. Dan, K. Seo, K. Takei, J. H. Meza, A. Javey, K. B. Crozier, Dramatic reduction of surface recombination by in situ surface passivation of silicon nanowires, Nano Lett. 11 (2011) 2527-2532.
[25] S. Kato, Y. Kurokawa, S. Miyajima, Y. Watanabe, A. Yamada, Y. Ohta, et al., Improvement of carrier diffusion length in silicon nanowire arrays using atomic layer deposition, Nanoscale Res. Lett. 8 (2013) 361.
[26] H. Zimmermann, H. Ryssel, Trivalent character of platinum in silicon, Appl. Phys. Lett. 58 (1991) 499.
[27] M. D. Miller, Lifetime-controlling recombination centers in platinum-diffused silicon, J. Appl. Phys. 47 (1976) 2569.
[28] C. France, The Reactivity Series of Metals. Available: http://www.gcsescience.com/rl-reactivity-series-metals.htm, 2014.
[29] M.-F. Ng, L. Y. Sim, H. Da, H. Jin, K. H. Lim, S.-W. Yang, Modulation of the work function of silicon nanowire by chemical surface passivation: a DFT study, Theor. Chem. Acc. 127 (2010) 689-695.
[30] T. C. Cheng, J. Shieh, W. J. Huang, M. C. Yang, M. H. Cheng, H. M. Lin, et al., Hydrogen plasma dry etching method for field emission application, Appl. Phys. Lett. 88 (2006) 263118.
[31] M. D. Kelzenberg, D. B. Turner-Evans, B. M. Kayes, M. a. Filler, M. C. Putnam, N. S. Lewis, et al., Single-nanowire Si solar cells, 2008 33rd IEEE Photovolatic Spec. Conf. (2008) 1-6.
[32] T. Xu, Y. Lambert, C. Krzeminski, B. Grandidier, D. Stiévenard, G. Léveque, et al., Optical absorption of silicon nanowires, J. Appl. Phys. 112 (2012) 033506.
[33] L. Hu, G. Chen, Analysis of optical absorption in silicon nanowire arrays for photovoltaic applications, Nano Lett. 7 (2007) 3249-3252.
[34] S.-K. Kim, R. W. Day, J. F. Cahoon, T. J. Kempa, K.-D. Song, H.-G. Park, et al., Tuning light absorption in core/shell silicon nanowire photovoltaic devices through morphological design, Nano Lett. 12 (2012) 4971-4976.
[35] R. a. Sinton, A. Cuevas, Contactless determination of current-voltage characteristics and minority-carrier lifetimes in semiconductors from quasi-steady-state photoconductance data, Appl. Phys. Lett. 69 (1996) 2510.

[36] W. Shockley, H. J. Queisser, Detailed Balance Limit of Efficiency of p-n Junction Solar Cells, J. Appl. Phys. 32 (1961) 510.

[37] W. Il Park, G. Zheng, X. Jiang, B. Tian, C. M. Lieber, Controlled synthesis of millimeter-long silicon nanowires with uniform electronic properties, Nano Lett. 8 (2008) 3004-3009.

[38] B. W. Shi, H. Peng, Y. Zheng, N. Wang, N. Shang, Z. Pan, et al., Synthesis of Large Areas of Highly Oriented, Very Long Silicon Nanowires, Adv. Mater. 12 (2000) 1343-1345.

[39] Y. Shi, Q. Hu, H. Araki, H. Suzuki, H. Gao, W. Yang, et al., Long Si nanowires with millimeter-scale length by modified thermal evaporation from Si powder, Appl. Phys. A. 80 (2004) 1733-1736.

[40] Y. F. Zhang, Y. H. Tang, C. Lam, N. Wang, C. S. Lee, I. Bello, et al., Bulk-quantity Si nanowires synthesized by SiO sublimation, J. Cryst. Growth. 212 (2000) 115-118.

[41] M. M. Adachi, A. J. Labelle, S. M. Thon, X. Lan, S. Hoogland, E. H. Sargent, Broadband solar absorption enhancement via periodic nanostructuring of electrodes, Sci. Rep. 3 (2013) 2928.

The subject matter of references 1-40 is all incorporated by reference in its entirety.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A method of making a photodetector cell comprising:
    forming a plurality of first contacts carried by a substrate and having a first work function value, each first contact comprising an ohmic contact of nickel;
    forming a plurality of second contacts carried by the substrate and having a second work function value different from the first work function value, each second contact comprising a Schottky contact of aluminum;
    forming a plurality of semiconductor wires carried by the substrate and having a third work function value between the first and second work function values;
    forming at least one semiconductor wire from the plurality thereof being coupled between a respective single first and second contact pair and comprising a photodiode junction; and
    forming other semiconductor wires from the plurality thereof each having a plurality of first and second contacts pairs coupled in alternating fashion to a single respective semiconductor wire.

2. The method of claim 1 wherein each semiconductor wire comprises a silicon nanowire.

3. The method of claim 1 wherein each semiconductor wire has a length about five times a minority, carrier diffusion length in the photodiode junction.

4. The method of claim 1 further comprising forming a dielectric layer over the plurality of semiconductor wires.

5. The method of claim 4 wherein the dielectric layer comprises silicon dioxide.

6. The method of claim 1 further comprising setting the third work function based upon at least one of an etching time, chemicals used in surface passivation, a nanowire diameter, and doping characteristics.

7. The method of claim 1 wherein the third work function is within a range of 4.5 eV to 5.01 eV.

8. A method of making a photodetector cell comprising:
    forming a plurality of first contacts carried by a substrate and having a first work function value, each first contact comprising an ohmic contact of nickel;
    forming a plurality of second contacts carried by the substrate and having a second work function value different from the first work function value, each second contact comprising a Schottky contact of aluminum;
    forming a plurality of semiconductor wires carried by the substrate and having a third work function value between the first and second work function values;
    forming at least one semiconductor wire from the plurality thereof being coupled between a respective single first and second contact pair and comprising a photodiode junction;
    forming a dielectric layer over the plurality of semiconductor wires; and
    forming other semiconductor wires from the plurality thereof each having a plurality of first and second contacts pairs coupled in alternating fashion to a single respective semiconductor wire;
    each semiconductor wire comprising a silicon nanowire and having a length about five times a minority carrier diffusion length in the photodiode junction.

9. The method of claim 8 wherein the dielectric layer comprises silicon dioxide.

10. The method of claim 8 further comprising setting the third work function based upon at least one of an etching time, chemicals used in surface passivation, a nanowire diameter, and doping characteristics.

11. The method of claim 8 wherein the third work function is within a range of 4.5 eV to 5.01 eV.

12. A method of forming a solar panel comprising:
    forming a plurality of photodetector cells, each photodetector cell comprising
        a substrate,
        a plurality of first contacts carried by the substrate and having a first work function value, each first contact comprising an ohmic contact of nickel,
        a plurality of second contacts carried by the substrate and having a second work function value different from the first work function value, each second contact comprising a Schottky contact of aluminum, and
        a plurality of semiconductor wires carried by the substrate and having a third work function value between the first and second work function values,
        at least one semiconductor wire from the plurality thereof being coupled between a respective single first and second contact pair and comprising a photodiode junction,
        other semiconductor wires from the plurality thereof each having a plurality of first and second contacts pairs coupled in alternating fashion to a single respective semiconductor wire.

13. The method of claim 12 wherein each semiconductor wire comprises a silicon nanowire.

14. The method of claim 12 wherein each semiconductor wire has a length about five times a minority carrier diffusion length in the photodiode junction.

15. The method of claim 12 further comprising forming a dielectric layer over the plurality of semiconductor wires.

16. The method of claim 15 wherein the dielectric layer comprises silicon dioxide.

17. The method of claim 12 further comprising setting the third work function based upon at least one of an etching time, chemicals used in surface passivation, a nanowire diameter, and doping characteristics.

18. The method of claim 12 wherein the third work function is within a range of 4.5 eV to 5.01 eV.

* * * * *